(12) United States Patent
Dell et al.

(10) Patent No.: US 9,015,522 B2
(45) Date of Patent: Apr. 21, 2015

(54) IMPLEMENTING DRAM FAILURE SCENARIOS MITIGATION BY USING BUFFER TECHNIQUES DELAYING USAGE OF RAS FEATURES IN COMPUTER SYSTEMS

(71) Applicant: International Business Machines Corporation, Armonk, NY (US)

(72) Inventors: Timothy J. Dell, Colchester, VT (US); Manoj Dusanapudi, Bangalore (IN); Prasanna Jayaraman, Bangalore (IN); Anil B. Lingambudi, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 13/693,353

(22) Filed: Dec. 4, 2012

(65) Prior Publication Data

US 2014/0157044 A1    Jun. 5, 2014

(51) Int. Cl.
*G06F 11/00* (2006.01)
*G06F 11/16* (2006.01)

(52) U.S. Cl.
CPC ................................. *G06F 11/1666* (2013.01)

(58) Field of Classification Search
CPC .. G06F 11/1666; G06F 11/20; G06F 12/0802
See application file for complete search history.

(56) References Cited

U.S. PATENT DOCUMENTS

| | | | |
|---|---|---|---|
| 7,529,965 B2 * | 5/2009 | Ikeuchi et al. | 714/6.2 |
| 2006/0117216 A1 * | 6/2006 | Ikeuchi et al. | 714/6 |
| 2009/0193290 A1 | 7/2009 | Arimilli et al. | |
| 2014/0089725 A1 * | 3/2014 | Ackaret et al. | 714/6.1 |

* cited by examiner

*Primary Examiner* — Charles Ehne
(74) *Attorney, Agent, or Firm* — Joan Pennington

(57) ABSTRACT

A method, system and computer program product are provided for implementing dynamic random access memory (DRAM) failure scenarios mitigation using buffer techniques delaying usage of RAS features in computer systems. A buffer is provided with a memory controller. Physical address data read/write failures are analyzed. Responsive to identifying predefined failure types for physical address data read/write failures, the buffer is used to selectively store and retrieve data.

17 Claims, 4 Drawing Sheets

IMPLEMENTING DRAM FAILURE SCENARIOS MITIGATION BY USING BUFFER TECHNIQUES DELAYING USAGE OF RAS FEATURES IN COMPUTER SYSTEMS

FIELD OF THE INVENTION

The present invention relates generally to the data processing field, and more particularly, relates to a method, system and computer program product for implementing dynamic random access memory (DRAM) failure scenarios mitigation using buffer techniques delaying usage of RAS features in computer systems, such as server computer systems.

DESCRIPTION OF THE RELATED ART

Reliability, Availability and Serviceability (RAS) are important features of any memory and computer system. Memory plays an important role in server systems and maintaining error free operation of a memory system including, for example, multiple memory modules, such as Dual In-Line Memory Modules (DIMMs) is important. Memory RAS features are increasingly important in various computer and server market segments.

A single-bit or multiple-bit failure on the memory controller to DIMM path can be traced and with suitable mechanisms, some or most of data can be recovered. Error checking and correcting (ECC) with single chip kill for memory are examples of industry-wide standard server RAS features currently deployed and widely used.

When encountered with more than two CEs (Correctable Errors) or one UE (Unrecoverable Error) on a data byte in a DIMM an error is flagged. Typically in many conventional arrangements either the DIMM needs to be taken offline or replaced to have a functional server system. A methodology to accommodate multiple bit failures could be accomplished by using a buffer pool before the data is actually written into the DIMMs. The buffer serves as a way to hold the data that goes out from memory controller to the DIMMs.

A need exists for an effective mechanism for implementing dynamic random access memory (DRAM) failure scenarios mitigation using buffer techniques in computer systems. It is desirable that such mechanism delays or effectively guards against usage of some RAS features, while providing sustained memory performance.

SUMMARY OF THE INVENTION

Principal aspects of the present invention are to provide a method, system and computer program product for implementing a method, system and computer program product for implementing dynamic random access memory (DRAM) failure scenarios mitigation using buffer techniques delaying usage of RAS features in computer systems. Other important aspects of the present invention are to provide such method, system and computer program product substantially without negative effects and that overcome many of the disadvantages of prior art arrangements.

In brief, a method, system and computer program product are provided for implementing dynamic random access memory (DRAM) failure scenarios mitigation using buffer techniques delaying usage of RAS features in computer systems. A buffer is provided with a memory controller. Physical address data read/write failures are analyzed. Responsive to identifying predefined failure types for physical address data read/write failures, the buffer is used to selectively store and retrieve data.

In accordance with features of the invention, the buffer optionally is located in the memory controller, provided as a stand alone buffer, for example, at a penultimate end of the memory controller, or provided with the DRAM, such as provided with Dual In-Line Memory Modules (DIMMs).

In accordance with features of the invention, range analysis logic providing failure analysis effectively determines the failure types and invokes required mitigation buffer techniques to empty the buffer.

In accordance with features of the invention, responsive to identifying predefined failure types for physical address data read/write failures including a single cell failure, the buffer is used to selectively store and retrieve data.

In accordance with features of the invention, responsive to identifying predefined failure types for physical address data read/write failures including one of a bitline failure with a common column address and wordline failure with a common row address, the buffer is used to selectively store and retrieve data.

In accordance with features of the invention, responsive to identifying predefined failure types for physical address data read/write failures, the buffer is used to selectively store and retrieve data and includes periodic clearance of the buffer and delay usage of RAS features.

In accordance with features of the invention, responsive to identifying predefined failure types for physical address data read/write failures including a wordline failure with a common row address, the buffer is used to selectively store and retrieve data and includes sending an interrupt to hypervisor.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and computer program product are provided for implementing DRAM failure scenarios mitigation using buffer techniques guard against or delaying usage of RAS features.

In accordance with features of the invention, a novel method of emptying the buffer, as and when data corruption happens and to make the buffer available at its fullest capacity ensuring the delay main RAS features usage as much as possible and keep the RAS features intact. The novel method enables moving the data to a good area by creating a capability in the buffer to talk to the hypervisor/operating system (PHYP/OS) through interrupt on buffer overflow or threshold overrun. Once done, then the failure range of physical addresses advantageously is identified and the physical addresses are converted to logical addresses. Enabling the failure range to be identified, especially for one odd failure, and then if the range can be isolated and moved to a different area by the PHYP/OS.

Figure 1:
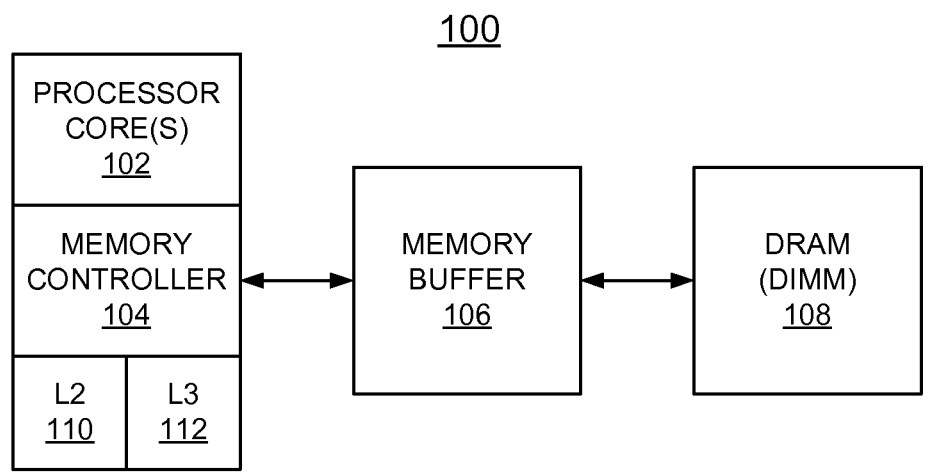
FIG. 1 is a block diagram representation illustrating an example system for implementing dynamic random access memory (DRAM) failure scenarios mitigation delaying usage of RAS features using buffer techniques in computer systems in accordance with the preferred embodiment.
Figure 2:
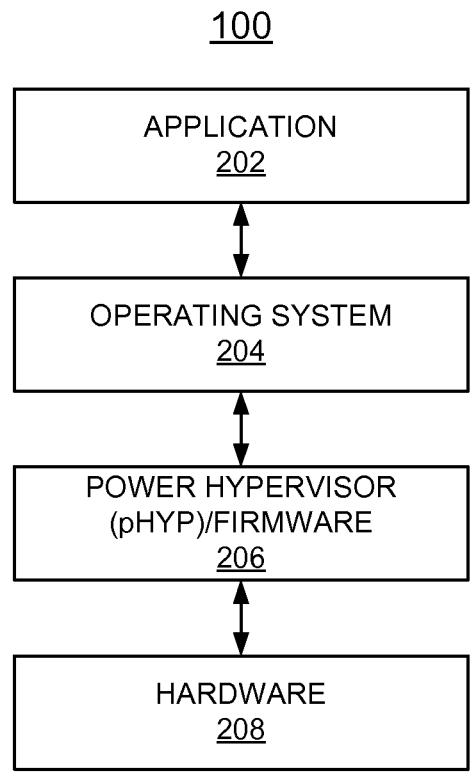
FIG. 2 is a block diagram illustrating the example operating system of FIG. 1 for implementing DRAM failure scenarios mitigation delaying usage of RAS features using buffer techniques in accordance with the preferred embodiment.

Having reference now to the drawings, in FIGS. 1 and 2, there is shown an example computer system generally designated by the reference character 100 for implementing DRAM failure scenarios mitigation in accordance with the preferred embodiment.

Computer system 100 includes one or more processor cores 102, a memory controller 104 coupled by a memory buffer 106 to a dynamic random access memory (DRAM), such as a Dual In-Line Memory Module (DIMM) 108. In FIG. 1, cache memory L2, 110 and L3, 112 is shown with the memory controller 104.

In FIG. 2, computer system 100 includes an application 202, an operating system 204, and a hypervisor and firmware 206, such as a power hypervisor (pHYP) and firmware 206, and hardware 208 using the controller 104 and memory buffer 106 for implementing DRAM failure scenarios mitigation using buffer techniques delaying usage of RAS features in accordance with the preferred embodiments.

Computer system 100 implements enhanced DRAM failure scenarios mitigation in accordance with the preferred embodiment. Computer system 100 is shown in simplified form sufficient for understanding the present invention. The illustrated computer system 100 is not intended to imply architectural or functional limitations. The present invention can be used with various hardware implementations and systems and various other internal hardware devices.

It should be understood that the memory buffer 106 optionally is located in the memory controller106, or provided as a stand alone buffer, for example, at a penultimate end of the memory controller 106, or provided with the DRAM, such as provided with Dual In-Line Memory Modules (DIMMs) 108.

Figure 3:
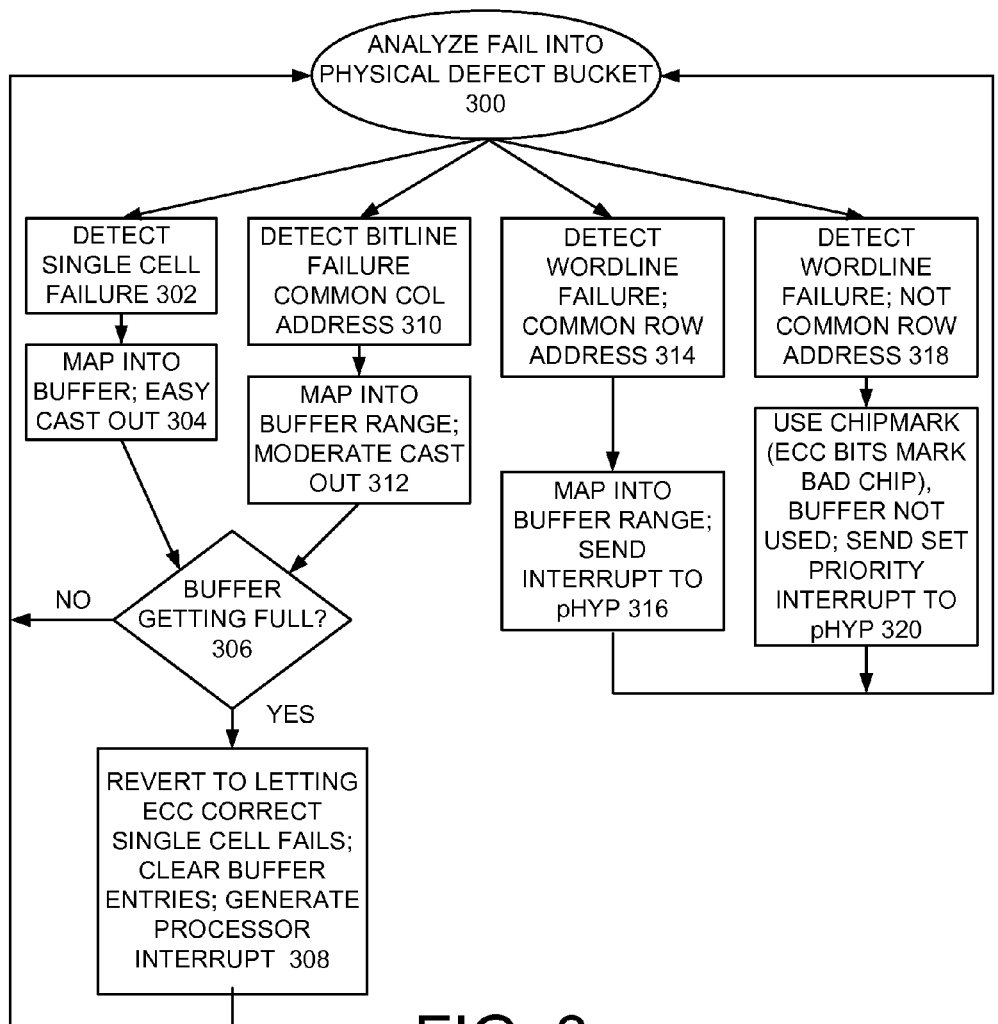
FIG. 3 is a flow chart illustrating exemplary operations for implementing DRAM failure scenarios mitigation delaying usage of RAS features using buffer techniques in accordance with the preferred embodiments.

Referring to FIG. 3, there is shown a flow chart illustrating exemplary operations for example performed by the memory controller 104 and power hypervisor and firmware 206 for implementing DRAM failure scenarios mitigation delaying usage of RAS features using buffer techniques with buffer 106 in accordance with the preferred embodiments. An identified memory failure or fail is analyzed to determine a failure type and provided into a physical defect bucket as indicated in a block 300.

In accordance with features of the invention, using the buffer 106 at the penultimate end of the memory controller 104 to store and retrieve data in case of physical address data read/write failures can be effectively used to create an infrastructure to effectively guard/delay against usage of RAS failures by (1.) invoking range analysis logic (RAL) that can effectively determine the failure types and invoke the required kind of mitigation techniques to empty the buffer and keep the RAS features intact; (2.) moving data around, by intimating to the hypervisor on the address or the range of addresses that seems to be problematic; (3.) watermark or threshold the buffer to create interrupts to reach the hypervisor; (4.) associating multiple scenarios of failure with interrupt priority for effective interrupt service routine (ISR); (5.) employing a periodic buffer clearance method to use the RAS features efficiently; and (6.) reverse engineering the physical address to the hypervisor understandable address range.

In accordance with features of the invention, the different kinds of real-time failures, that can be defined and compared as use-case scenario against a buffer scheme can be broadly classified as follows and the fail modes to the proposed handling scheme include, for example, (a) 65%—single cells: 1. map into buffer to prevent alignment and 2. easily cast out and force ECC to correct to free-up more buffer space;

(b) 20%—bitline oriented fails: 1. restricted to address range within one DRAM wordline; 2. detect by looking for n high-order address bits in common; and 3. map range to buffer with moderate cast out;

(c) 10%—wordline oriented fails: 1. large address range over 1 or 2 DQs (physical data input/output terminals); 2. detect by distinct high-level address bits; and 3. map large range to buffer and send interrupt to power hypervisor (pHYP) 206; and (d) 5%—chipkill oriented fails: 1. block of addresses and Do's too large for buffer; 2. add information to ECC (chip mark hardware); and 3. send interrupt to pHYP.

Fail analysis at block 300 is invoked responsive to the capability to identify a memory failure, which already exists, for example, the failure trigger could come from existing infrastructure and that is how buffer 106 will be invoked to store the data. The failure trigger starting from single address failure to multiple addresses, single bit failure to multiple bit failures and the buffer starts to fill up the data that now can not be able to store in the DRAM/DIMM 108. This can be achieved by using the existing technique of failure analysis and that can feed the block 300, also called range analysis logic (RAL) which can then determine how and when to raise the interrupt based on the criticality and the number of failures and the speed in which the buffer fills up. The memory controller 104 can be used to convert the physical or real address to physical address by converting the problematic address or range of addresses back track to the real address. This is easy using a reverse algorithm of the physical to real address conversion by memory controller 104.

In FIG. 3, a detected single cell failure as indicated in a block 302 is mapped into the buffer for easy cast out as indicated in a block 304. Checking is performed to determine if the buffer is getting full as indicated in a decision block 306. As indicated in a block 308, operations revert to letting ECC correct single cell fails; buffer entries are cleared and a processor interrupt is generated. Operations then return to block 300 and continue to analyze identified fails. A detected bitline failure with a common column address as indicated in a block 310 is mapped into the buffer for moderate cast out as indicated in a block 312. Checking is performed to determine if the buffer is getting full at decision block 306.

It should be understood that the trigger from the buffer 106 to the power hypervisor via the interrupt, can be achieved by many conditions in which the interrupt could be triggered. It can be again tracked to set of registers, for example, provided in hardware 208 that stores the failure address range and the interrupt service routine can read those registers for more details on the failure. For example, Range Analysis Identification can be used to trigger the interrupt. RAL (Range Analysis Logic) can trigger a high priority interrupt to the processor with the range information.

For example, it is determined at decision block 306 that the buffer is getting full when a buffer threshold or watermark level is identified to create interrupts to reach the hypervisor. Overflow of the buffer is avoided before multiple entries in the buffer with different address values have been filled. Optionally before buffer overflows, processor to be communicated with multiple addresses to clear the buffer. Depending on a number of range registers available, such as provided in hardware 208, entries from the buffer are cleared and generating interrupt to the processor. Optionally periodic buffer clearance is implemented by periodically checking if multiple entries are in the buffer and no range can be detected by RAL (Range Analysis Logic) at block 300. As entries are identified, the range registers are filled and once all available range registers are full, an interrupt can be triggered to the processor.

In FIG. 3 as indicated in a block 314, a detected wordline failure with a common row address as indicated in a block 314 is mapped into the buffer range and an interrupt is sent to the hypervisor as indicated in a block 316. As indicated in a block 318, a detected wordline failure and not common row address or multiple row addresses, then as indicated in a block 320 chipmark is used with ECC bits marking chip as bad, the buffer is not used and an interrupt is sent to the hypervisor. For example, a different interrupt priority is provided at block 316 and block 320. Based on range analysis logic (RAL) capability to identify the nature of the failure, how bad it is or determine from other infrastructure on the type and severity of the failure and determining the severity, the RAL is able to interrupt the pHYP as priority 1 or wait on the RAL to populate the set of the registers, such as in cases when a range can not be identified, then the interrupt to the hypervisor with the odd failing locations as priority 2.

It should be understood that the interrupt resources can include new status register or new bits in existing status registers to communicate to the processor or hypervisor where interrupt reason is memory errors; new range registers to communicate address ranges where failures are detected; new bits inside interrupt routing resources to support new interrupt; new priority levels with respect to existing interrupts; and with changes to masking of interrupts.

It should be understood that the handling of the interrupt by pHYP can be implemented for example, by the interrupt being presented to the thread which is running pHYP or to any thread depending on the way routing is coded. In either case control of the processor is routed to fixed interrupt vector location, and the interrupt can be generated as a HMI (hypervisor maintenance interrupt) or DSI (Data storage Interrupt). Once pHYP gets this interrupt, it checks the status register to read the reason Code. Multiple reason codes can be given depending on the trigger mechanism as described above. The pHYP stores the machine state when interrupt generated from HSRR1 to its local structure. pHYP reads range registers to detect the ranges. If the range is big enough (depends on how pHYP allocates to multiple logical partitions, pHYP triggers memory map copying from failed range to new range. If address range is not big enough to move complete logical partition, pHYP communicates to OS about the failure range and let OS manage application's memory map. For example, interleaving the movement request with the existing memory transactions can determine if its minimum hardware is enough to do or PHYP/OS should do. In case of PHYP/OS doing it, then use watermark to get back to the last known-state and avoid addresses or address ranges. More importantly check on scenarios on how the fails occur, including how many times we might have single bit failure or a range of address failure and then bit failure and DRAM failure.

Figure 4:
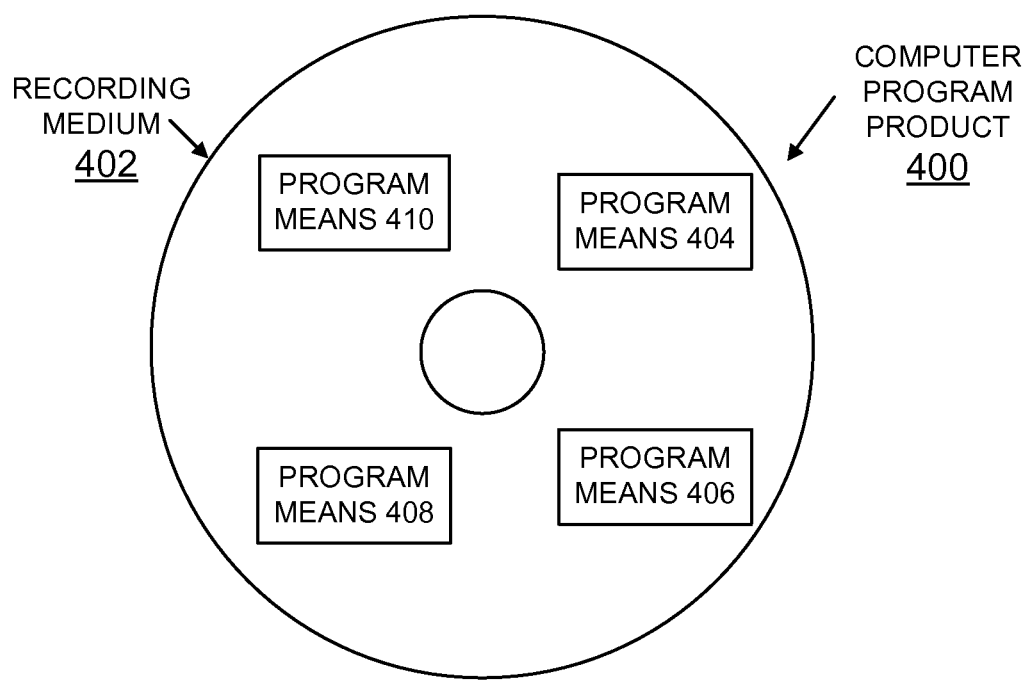
FIG. 4 is a block diagram illustrating a computer program product in accordance with the preferred embodiment.

Referring now to FIG. 4, an article of manufacture or a computer program product 400 of the invention is illustrated. The computer program product 400 is tangibly embodied on a non-transitory computer readable storage medium that includes a recording medium 402, such as, a floppy disk, a high capacity read only memory in the form of an optically read compact disk or CD-ROM, a tape, or another similar computer program product. Recording medium 402 stores program means 404, 406, 408, and 410 on the medium 402 for carrying out the methods for implementing memory performance management and enhanced memory reliability accounting for system thermal conditions of the preferred embodiment in the system 100 of FIG. 1.

A sequence of program instructions or a logical assembly of one or more interrelated modules defined by the recorded program means 404, 406, 408, and 410, direct the computer system 100 for implementing memory performance management and enhanced memory reliability accounting for system thermal conditions of the preferred embodiment.

While the present invention has been described with reference to the details of the embodiments of the invention shown in the drawing, these details are not intended to limit the scope of the invention as claimed in the appended claims.

What is claimed is:

1. A method for implementing dynamic random access memory (DRAM) failure scenarios mitigation using buffer techniques in a computer system comprising:
    providing a buffer with a memory controller;
    analyzing address range of identified physical address data read/write failures;
    identifying predefined failure types for the identified physical address data read/write failures,
    providing range analysis logic for implementing failure analysis, said range analysis logic effectively determines the failure types and provides buffer control to empty the buffer; and
    using the buffer to selectively store and retrieve data, responsive to identified predefined failure types.

2. The method as recited in claim 1 wherein identifying predefined failure types for the identified physical address data read/write failures includes identifying a single cell failure, and using the buffer to selectively store and retrieve data.

3. The method as recited in claim 1 wherein identifying predefined failure types for the identified physical address data read/write failures includes identifying a single bitline failure with a common column address, and using the buffer to selectively store and retrieve data.

4. The method as recited in claim 1 wherein identifying predefined failure types for the identified physical address data read/write failures includes identifying a single wordline failure with a common row address, and using the buffer to selectively store and retrieve data.

5. The method as recited in claim 4 includes sending an interrupt to a system hypervisor.

6. The method as recited in claim 1 wherein responsive to an identified predefined failure types including a wordline failure not including a common row address, using chipmark and not using the buffer, and sending a set priority interrupt to a system hypervisor.

7. The method as recited in claim 1 includes clearing buffer entries before buffer overflow and includes sending an interrupt to a system hypervisor.

8. A system for implementing dynamic random access memory (DRAM) failure scenarios mitigation using buffer techniques in a computer system comprising:
 a memory including dynamic random access memory (DRAM);
 a memory controller coupled to said memory;
 a buffer provided with said memory controller;
 said memory controller, analyzing address range of identified physical address data read/write failures;
 said memory controller, identifying predefined failure types for the identified physical address data read/write failures,
 said memory controller, using said buffer to selectively store and retrieve data, responsive to identified predefined failure types; and
 said memory controller clearing buffer entries before buffer overflow and sending an interrupt to a system hypervisor.

9. The system as recited in claim 8 includes range analysis logic for implementing failure analysis of identified physical address data read/write failures.

10. The system as recited in claim 9 wherein said range analysis logic effectively determines failure types and provides buffer control to empty the buffer.

11. The system as recited in claim 8 wherein said memory controller identifying predefined failure types for the identified physical address data read/write failures includes said memory controller identifying a single cell failure, and said memory controller, using said buffer to selectively store and retrieve data.

12. The system as recited in claim 8 wherein said memory controller identifying predefined failure types for the identified physical address data read/write failures includes said memory controller identifying a bitline failure with a common column address, and said memory controller, using said buffer to selectively store and retrieve data.

13. The system as recited in claim 8 wherein said memory controller identifying predefined failure types for the identified physical address data read/write failures includes said memory controller identifying a wordline failure with a common row address, and said memory controller, using said buffer to selectively store and retrieve data.

14. The system as recited in claim 13 includes said memory controller sending an interrupt to a system hypervisor.

15. The system as recited in claim 8 includes said memory controller responsive to an identified predefined failure types including a wordline failure not including a common row address, marking a chip as bad and not using the buffer.

16. The system as recited in claim 15 includes said memory controller sending a set priority interrupt to a system hypervisor.

17. The system as recited in claim 8 wherein said buffer is selectively located at a penultimate end of said memory controller, with said memory controller or with said memory.

* * * * *